United States Patent [19]

Roos

[11] Patent Number: 5,062,801

[45] Date of Patent: Nov. 5, 1991

[54] FUNCTION UNIT IN WHICH CIRCUIT BOARDS ARE MOUNTED ON A CENTER PLANE BY WAY OF DISTRIBUTION BOARDS

[75] Inventor: Sture G. Roos, Bergshamra, Sweden

[73] Assignee: Telefonaktiebolaget L M Ericsson, Sweden

[21] Appl. No.: 582,355

[22] Filed: Sep. 14, 1990

[30] Foreign Application Priority Data

Oct. 2, 1989 [SE] Sweden .............................. 8903228

[51] Int. Cl.[5] .............................................. H05K 1/14
[52] U.S. Cl. ........................................ 439/61; 361/413
[58] Field of Search ................ 439/61, 62, 74, 54, 439/64, 65; 361/412, 413, 415

[56] References Cited

U.S. PATENT DOCUMENTS

| | | | |
|---|---|---|---|
| 2,537,245 | 1/1951 | Thompson | 280/485 |
| 2,701,346 | 1/1955 | Powell | 339/17 |
| 3,660,803 | 5/1972 | Cooney | 439/637 |
| 4,472,765 | 9/1984 | Hughes | 361/413 |
| 4,703,394 | 10/1987 | Petit et al. | 439/544 |
| 4,708,660 | 11/1987 | Claeys et al. | 439/79 |
| 4,876,630 | 10/1989 | Dara | 361/413 |
| 4,894,753 | 1/1990 | Wadell et al. | 361/413 |

FOREIGN PATENT DOCUMENTS

| | | | |
|---|---|---|---|
| 3402644 | 8/1985 | Fed. Rep. of Germany | 439/74 |
| 0538166 | 7/1941 | United Kingdom | 280/484 |

Primary Examiner—Neil Abrams
Attorney, Agent, or Firm—Burns, Doane, Swecker & Mathis

[57] ABSTRACT

The present invention relates to a function unit for electronic equipment, comprising a center plane with contact pins mounted thereon, distribution boards which can be inserted at right angles to the center plane, from both sides thereof, and circuit boards capable of being connected in plane-parallel with the distribution boards. In accordance with the invention, the center plane is provided with groups of contact pins disposed in rows and columns, the pins being isolated electrically from the center plane and extending therethrough. The contact pins are disposed along one whole edge margin of the center plane in a terminal field which can be reached from one side of the center plane. The distribution boards along the edge margin which faces towards the center plane are provided with a contact device adapted to mate with the contact pins, whereas the opposing edge margin is provided with one or more contact devices for connection of a coinciding number of circuit boards. The distribution boards on the same side as the terminal field are inserted parallel with the field and on the opposite side of the center plane are inserted perpendicularly to the terminal field.

20 Claims, 2 Drawing Sheets

FUNCTION UNIT IN WHICH CIRCUIT BOARDS ARE MOUNTED ON A CENTER PLANE BY WAY OF DISTRIBUTION BOARDS

TECHNICAL FIELD

The present invention relates to a function unit for electronic equipment, and in particular for telecommunication equipment, comprising a center plane which has electrical contact pins disposed thereon; distribution boards which can be fitted to the center plane perpendicularly from both sides thereof, and circuit boards which can be connected to said distribution boards in plane-parallel therewith.

PRIOR ART

Normally, function units for electronic equipment and telecommunication equipment are designed so that related functions, such as selection functions and subscriber functions, are mounted on a plurality of circuit boards which are mutually connected electrically by means of a back plane mounted in a magazine and common to said circuit boards, and the requisite electrical connections are effected through the medium of conductor paths provided in the back plane. The connection between function units of mutually the same kind or of mutually different kinds is effected through the medium of conductors, such as coaxial cables and optolinks which are connected to the functional units at the front edge of the circuit boards or to separate terminal fields or panels on the back plane.

Since, for instance, a telephone exchange of even relatively small capacity requires a large number of mutually different function units, the equipment seen as a whole has become highly space consuming and because of the numbers of cables or wires required between the various function units, it is difficult to obtain an overall view of the equipment. This makes it difficult to carry out repair work and maintenance. The necessary peripheral equipment, such as cooling equipment and the like, has resulted in additional space requirements with accompanying limitations to the space available for the telecommunication equipment.

As before mentioned, the various circuit boards mounted in a magazine intended herefor have been mutually connected by conductor paths in the back plane. The progressively increasing miniaturization of components with the subsequent possibility of densely packing the circuit boards has, to some extent, alleviated the aforesaid drawbacks relating to space requirements. At the same time, however, the need of conductor paths in the back plane for making the necessary connections has increased. It has not been possible, however, to fulfill this requirement completely, since the space available in the back plane between the requisite contact pins has not been sufficiently large for the purpose.

DESCRIPTION OF THE INVENTION

Accordingly, the object of the present invention is to provide a function unit for electronic equipment, particularly telecommunication equipment, which will avoid the aforementioned drawbacks. This object is achieved by replacing the conventional back plane with a center plane having disposed thereon in rows and columns of through-passing electrical contact pins arranged in groups to which a plurality of circuit boards can be connected from both sides of the plane. The contact boards, however, are not connected directly to the center plane, but through the intermediary of intermediate distribution boards, each of which distribution boards extends across the whole of the center plane and is common to several mutually adjacent circuit boards. The requisite connections between the circuit boards is effected with the aid of conductor paths in the distribution boards. Furthermore, the distribution boards, and thus also associated circuit boards, on one side of the center plane are fitted perpendicularly to the distribution boards on the other side of said center plane, thereby enabling all circuit boards to be connected to one another without requiring the provision of additional conductor paths. Finally, a terminal field is arranged along at least one edge of the center plane so as to be accessible from one side of the plane for incoming and outgoing signal lines to other function units, current supply cables and the like.

A second terminal field is preferably arranged along a second edge, perpendicularly to the first mentioned edge on the center plane, this second terminal field being accessible from the opposite side of the center plane.

Preferably, electrically conductive plates are attached to the ;, center plane in parallel with and externally of the distribution boards and associated circuit boards, these plates functioning as EMC-screens for the function unit. The corners of the plates distal from the center plane are mutually connected by means of plate-connecting profiles.

An advantage is afforded when guide bars are mounted between the center plane and the connection profiles for guiding the distribution boards when fitting said boards to said plane, and when further guide bars are mounted on the distribution boards for guiding the circuit boards when fitting the same.

The center plane preferably consists of a sheet of electrically conductive material and the electrical contact pins passing through the center plane are electrically isolated from the plate by means of insulating sleeves. Earth pins which are in electrically conductive contact with the center plane may be disposed between the groups of contact pins. These earth pins extend from the center plane and into the electrical contact device on corresponding distribution boards.

A function unit constructed in accordance with the invention provides several advantages. One important advantage is that the mutually perpendicular distribution boards enable all circuit boards in the function unit to be connected together in a simple and purposeful manner, without requiring the provision of additional conductors. The conductors required for electrical supply and signal transmission can be connected readily to the function unit in the terminal field with a clear view of the equipment.

Another advantage is that possible changes in the mutual connections between the circuit boards can be effected readily by an exchange of distribution board. Replacement of circuit boards which are found to be faulty or for other reasons is also made easier, since each distribution board is common to several circuit boards, and hence each of the circuit boards may be constructed for a particular purpose, i.e. given the form of a special duty board, more readily than has hitherto been possible, while at the same time being smaller in size and therefore more readily handled.

The arrangement of a further terminal field on the side of the center plane opposite to the first mentioned terminal field provides the advantage of enabling the function units to be connected more readily to other function units in an easily viewed manner, so that incoming signal lines can be connected on the front side and outgoing signal lines connected to the rear side, for instance.

A further advantage is that the plates which function as EMC-screens function, together with the plate-connecting profiles, form a magazine for housing distribution boards and circuit boards. The guide bars therewith facilitate insertion of the boards into the magazine.

When the center plane is made of an electrically conductive material, the advantage is afforded that the center plane will function as an EMC-screen between the distribution boards and the circuit boards on respective sides of the center plane. One side of the center plane can therefore be configured as a high voltage environment and the other side as a low voltage environment, in a purposeful manner. Earth pins can be readily disposed between the groups of electrical contact pins at the intersection points between the distribution boards and will function as additional screens between the mutually different environments.

Further advantages afforded by an inventive function unit will be evident from the following description of a preferred exemplifying embodiment of the invention described with reference to the accompanying drawings.

BEST MODE OF CARRYING OUT THE INVENTION

Figure 1:
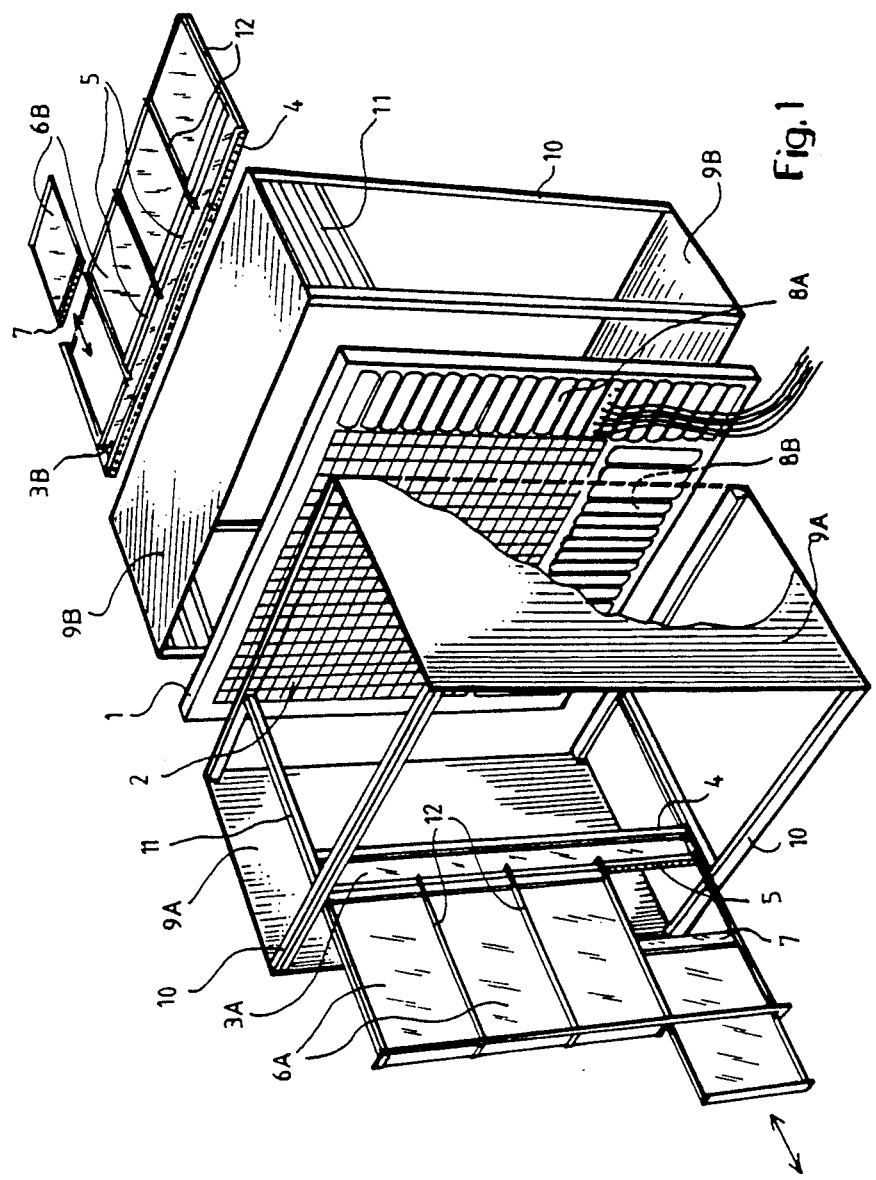
FIG. 1 is a perspective, exploded view of the principle construction of an inventive function unit.

FIG. 1 illustrates the principle construction of an inventive function unit. The function unit includes a center plane 1 which has mounted thereon a large number of electrical contact pins 2 which are isolated electrically from the center plane and which extend through said plane. The contact pins 2 are distributed over substantially the whole surface area of the center plane and are arranged groupwise in rows and columns, said groups of contact pins being located at the intersection points between distribution boards 3A and 3B on the front side and rear side of the center plane respectively. The contact-pin arrangement will be described in more detail below with reference to FIG. 2.

As beforementioned, the contact pins 2 are arranged over substantially the whole of the surface area of said center plane 1, and hence there is no room on the center plane for conductor paths. These conductor paths, required to enable all conceivable electrical connections to be made between the various components of the function unit, are mounted on the aforesaid distribution boards 3A and 3B. The distribution boards 3A on one side of the center plane 1, i.e. the front side as seen in FIG. 1, are therewith fitted perpendicularly to the center plane and extend along the whole of said center plane in the vertical direction, as seen in FIG. 1, where for the sake of clarity only one distribution board is shown. Similar distribution boards 3B are mounted on the opposite side of the center plane 1, i.e. on the rear side of said plane as seen in the Figure. The distribution boards 3B also extend over the whole of the center plane, but distinct to the distribution boards 3A are placed horizontally. Both the distribution boards 3A and the distribution boards 3B are therewith provided with electrical contact devices 4 which extend along the whole of one side of the distribution boards and can be connected to contact pins on the center plane 1. Each distribution board 3A can, in this way, be connected to one column of groupwise arranged contact pins 2, whereas each distribution board 3B can be connected to a row of groupwise arranged contact pins.

The distribution boards 3A and 3B are provided with a plurality of electrical contact devices 5, for instance four devices, along the side thereof opposite to the side provided with the contact devices 4, as illustrated in the Figure. Circuit boards 6A on the front side of the center plane and circuit boards 6B on the rear side of said plane can be connected to the distribution boards via these contact devices 5. Thus, in the case of the illustrated embodiment, four circuit boards 6A or 6B can be connected to each distribution board. Each circuit board is therewith provided with a contact device 7 which is adapted to mate with the contact device 5. The arrangement is such that the circuit boards 6A and 6B can be connected in parallel planes to corresponding distribution boards 3A and 3B respectively.

In order to enable the function unit to be connected to other function units or to other equipment, a terminal field 8A is provided on the front side of the center plane 1, along one edge margin thereof. The terminal field 8A extends parallel with the distribution boards 3A on this side of the center plane and is quite simply a field where no distribution board is connected to the center plane. However, on the rear side of the center plane distribution boards 3B also extend over the contact pins within this region. The terminal field 8A, which can thus be reached from the front side of the plane, is used for incoming and outgoing signal lines, current supply lines and the like. If necessary, a further terminal field 8B can be provided on the rear side of the center plane 1, this terminal field 8B extending perpendicularly to the terminal field 8A. The terminal field 8B has been obtained in a manner similar to the terminal field 8A, i.e. by omitting a number of distribution boards 3B.

FIG. 1 also illustrates two pairs of electrically conductive plates 9A and 9B respectively, which function as EMC-screens for the distribution boards and circuit boards. The plates 9A on the front side of the center plane therewith extend parallel to and externally of the distribution boards 3A and the circuit boards 6A and have the same geometric extension as said boards. Correspondingly, the plates 9B on the rear side of the central plane are arranged parallel with and externally of the distribution boards 3B and the circuit boards 6B and have the same extension as said boards. Both the plates 9A and the plates 9B are screwed firmly to the center plane in some appropriate manner and the corners of the plates distal from the center plane are joined together by means of plate-connecting members 10. Thus, it can be said that the plates 9A and 9B respectively, together with the center plane 1, form two magazines for the distribution boards 3A and the circuit boards 6A and for the distribution boards 3B and the circuit boards 6B respectively. In order to facilitate insertion of the distribution boards 3A and 3B respectively, guide bars 11 are disposed between the center plane 1 and the connecting members 10, said guide bars 11 thus functioning as guides when fitting respective distribution boards. The distribution boards are also provided with guide bars 12 between and externally of the contact devices 5 respectively, in order to guide insertion of the circuit boards in a corresponding manner.

Figure 2:
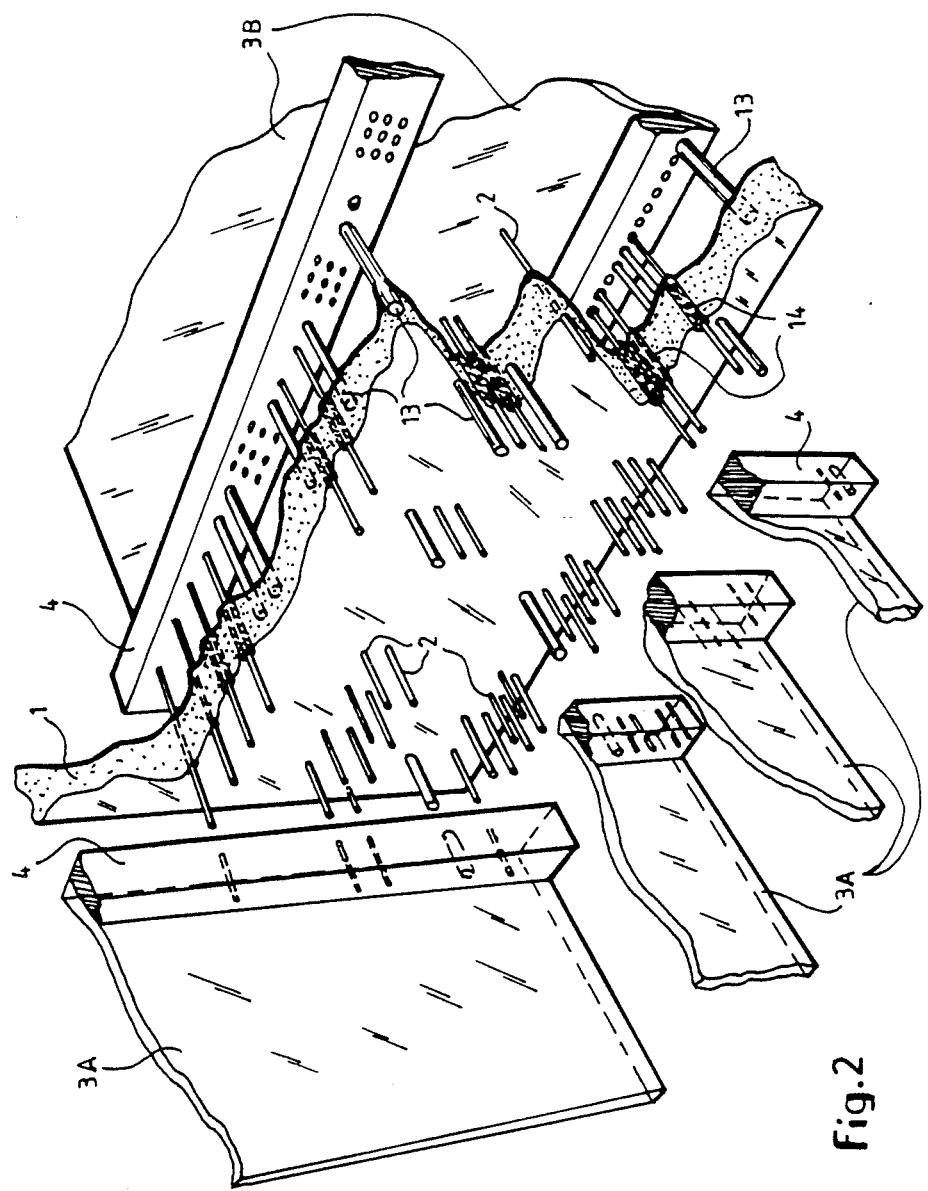
FIG. 2 illustrates in perspective part of the arrangement of electrical contact pins or connector pins in the center plane and associated distribution board.

Illustrated in FIG. 2 is part of the center plane 1 and its contact pins 2. For the sake of illustration, only a few contact pins 2 have been drawn in the Figure. The Figure also shows the manner in which a number of distribution boards 3A and 3B respectively are connected to the center plane. The Figure shows that the contact pins 2 extend through the center plane 1 and that these pins can be connected to respective contact devices 4 on the distribution boards 3A and 3B. In the case of the illustrated embodiment, the center plane 1 consists of a plate made of electrically conductive material, such as aluminium for instance.

In order to isolate the contact pins 2 electrically from the center plane, the pins must be insulated therefrom, which is achieved with the aid of insulating sleeves 14 which embrace respective contact pins 2. When the center plane is made of an electrically conductive material, earth pins 13 can be arranged between the contact pins 2. The earth pins 13 are anchored in the center plane 1 in an appropriate manner and extend from said plane solely in one direction and are so arranged that the earth pins will extend in to corresponding contact devices 4 on opposite sides externally of the groups of contact pins 2.

As beforementioned, only a few contact pins 2 have been shown in FIG. 2 for the sake of clarity. Furthermore, the various groups are shown to contain different numbers of pins. In reality, 1 however, each group will contain an equal number of contact pins 2, for instance three times three pins. In the case of the illustrated embodiment, the number of earth pins 13 will be three pins above and beneath each group of contact pins 2 on the front side of the center plane and correspondingly three pins to the left and to the right of each group of contact pins 2 on the rear side of the plane. It will be understood, that the number of contact pins 2 and corresponding number of earth pins 13 within the groups may be different to that recited above.

It will therefore be understood that the invention is not restricted to the aforedescribed and the illustrated embodiments, but that modifications can be made within the scope of the following claims.

I claim:

1. A function unit for electronic equipment, comprising:

a center plane having electrical contact pins mounted thereon over a substantial portion of its surface area, said contact pins being arranged in rows and columns on said center plane to form groups, said contact pins being electrically insulated form the center plane and including contact pins disposed along one edge margin of the center plane in a first terminal field, said first terminal field extending longitudinally along substantially the whole of said one edge margin and being accessible from one side of the center plane, said first terminal field being adapted to be connected with at least incoming and outgoing signal lines and current supply lines;

a plurality of distribution boards adapted to be mounted substantially perpendicularly to and on opposite sides of said center plane, each of said distribution boards being provided with a first electrical contact device along one edge thereof that is adapted to face towards the center plane and being provided with at least one second electrical contact device along an opposite edge thereof, said first electrical contact devices being adapted to mate with said contact pins; and a plurality of circuit boards, each of said circuit boards being provided with a connection device for connection to one of said second electrical contact devices on said distribution boards, said circuit boards being adapted to be positioned in a plane substantially parallel to the plane in which lies the respective distribution board to which the circuit board is to be attached, said distribution boards extending transversely across a substantial portion of the center plane and being provided with means for effecting the distribution of electrical signals to, from the between the circuit boards, the distribution boards adapted to be mounted on said one side of the center plane being adapted to be positioned substantially parallel to the longitudinal extent of the first terminal field, the distribution boards adapted to be mounted on the opposite side of the center plane being adapted to be positioned substantially perpendicular to the longitudinal extent of the first terminal field.

2. The function unit according to claim 1, wherein the contact pins disposed along a second edge margin of the center plane that is substantially perpendicular to said one edge margin of the center plane are arranged in a second terminal field, said second terminal field extending substantially perpendicular to said first terminal field and along substantially the entire second edge margin, said second terminal field being accessible form the opposite side of the center plane.

3. The function unit according to claim 1, including plates of electrically conductive material being adapted to be mounted on the center plane generally parallel to and external of the distribution boards and circuit boards, said plates having corners positioned distal from said center plane that are connected to one another by connecting members, said plates functioning as EMC-screens.

4. The function unit according to claim 2, including plates of electrically conductive material being adapted to be mounted on the center plane generally parallel to and external of the distribution boards and circuit boards, said plates having corners positioned distal from said center plane that are connected to one another by connecting members, said plates functioning as EMC-screens.

5. The function unit according to claim 3, including guide bars mounted between the center plane and the connecting members for guiding said distribution boards, and guide bars mounted on and extending outwardly from the distribution boards between and externally of the second contact devices for guiding the circuit boards when they are mounted on their respective distribution board.

6. The function unit according to claim 4, including guide bars mounted between the center plane and the connecting members for guiding said distribution boards, and guide bars mounted on and extending outwardly from the distribution boards between and externally of the second contact devices for guiding the circuit boards when they are mounted on their respective distribution board.

7. The function unit according to claim 1, wherein said center plane is a plate of electrically conductive material, said contact pins being surrounded with insulative sleeves for electrically insulating the contact pins from the center plane.

8. The function unit according to claim 2, wherein the center plane is a plate of electrically conductive material, said contact pins being surrounded with insulative sleeves for electrically insulating the contact pins from the center plane.

9. The function unit according to claim 5, wherein said center plane is a plate of electrically conductive material, said contact pins being surrounded with insulative sleeves for electrically insulating the contact pins from the center plane.

10. The function unit according to claim 7, including earth pins mounted on the center plane in electrically conductive contact with said center plane, said earth pins being positioned between the groups of contact pins, said earth pins extending out from the center plane and said first contact devices being provided with apertures for receiving the earth pins.

11. The function unit according to claim 2, including earth pins mounted on the center plane in electrically conductive contact with said center plane, said earth pins being positioned between the groups of contact pins, said earth pins extending out from the center plane and said first contact devices being provided with apertures for receiving the earth pins.

12. The function unit according to claim 3, including earth pins mounted on the center plane in electrically conductive contact with said center plane, said earth pins being positioned between the groups of contact pins, said earth pins extending out from the center plane and said first contact devices being provided with apertures for receiving the earth pins.

13. The function unit according to claim 5, including earth pins mounted on the center plane in electrically conductive contact with said center plane, said earth pins being positioned between the groups of contact pins, said earth pins extending out from the center plane and said first contact devices being provided with apertures for receiving the earth pins.

14. A function unit for electronic equipment, comprising:
a center plane having electrical contact pins mounted thereon over a substantial portion of its surface area, said contact pins being electrically insulated from the center plane and including contact pins disposed along one edge margin of the center plane in a first terminal field, said first terminal field extending longitudinally along said one edge margin and being accessible from one side of the center plane, said first terminal field being adapted to be connected with at least incoming and outgoing signal lines and current supply lines;
a plurality of distribution boards adapted to be mounted substantially perpendicularly to and on opposite sides of said center plane, each of said distribution boards being provided with a first electrical contact device along an edge thereof that is adapted to face towards the center plane and a second electrical contact device along an opposite edge thereof, said first electrical contact device being adapted to mate with said contact pins; and
a plurality of circuit boards, each of said circuit boards being provided with a connection device for connection to one of said second electrical contact devices on said distribution boards, said circuit boards being adapted to be positioned in a plane substantially parallel to the plane in which lies the distribution board to which the circuit board is to be connected, said distribution boards extending transversely across a substantial portion of the center plane and being provided with means for effecting electrical connection between circuit boards so that the distribution of signals to and from the circuit boards is provided by the distribution boards.

15. The function unit according to claim 14, wherein the distribution boards adapted to be mounted on said one side of the center plane are positioned substantially parallel to the longitudinal extent of the first terminal field and the distribution boards adapted to be mounted on the opposite side of the center plane are positioned substantially perpendicular to the longitudinal extent of the first terminal field.

16. The function unit according to claim 14, wherein said distribution boards are other than circuit boards.

17. The function unit according to claim 14, wherein the contact pins disposed along a second edge margin of the center plane that is substantially perpendicular to said one edge margin of the center plane are arranged in a second terminal field, said second terminal field extending substantially perpendicular to said first terminal field and along substantially the entire second edge margin, said second terminal field being accessible from the opposite side of the center plane.

18. The function unit according to claim 14, including plates of electrically conductive material being adapted to be mounted on the center plane generally parallel to and external of the distribution boards and circuit boards, said plates having corners positioned distal from said center plane that are connected to one another by connecting members, said plates functioning as EMC-screens.

19. The function unit according to claim 14, including guide bars mounted between the center plane and the connecting members for guiding said distribution boards, and guide bars mounted on and extending outwardly from the distribution boards between and externally of the second contact devices for guiding the circuit boards when they are mounted on their respective distribution board.

20. The function unit according to claim 14, wherein said center plane is a plate of electrically conductive material, said contact pins being surrounded with insulative sleeves for electrically insulating the contact pins from the center plane.

* * * * *